July 24, 1962 R. BASIAGO ETAL 3,046,458

HALL PLATE

Filed April 23, 1959

INVENTORS
RAYMOND BASIAGO
NEAL T. WILLIAMS
BY
George H. Fritzinger
AGENT 3,046,458
HALL PLATE Raymond Basiago, Morris Plains, and Neal T. Williams, Bloomfield, N.J., assignors to McGraw-Edison Company, Elgin, Ill., a corporation of Delaware Filed Apr. 23, 1959, Ser. No. 808,529
4 Claims. (Cl. 317—234)

Figure 1:
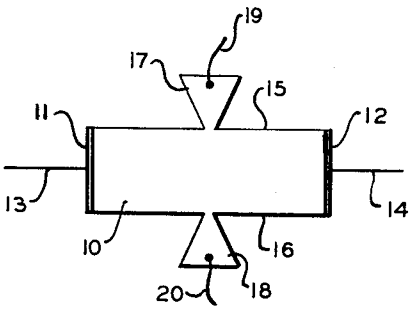

This invention relates to semi-conductive plate-like bodies of the Hall effect type, and more particularly it relates to a novel form of Hall plate and to a precision method of producing such plates so that the same will have substantially no output voltage when not threaded by a magnetic flux.

Hall plates are semi-conductive bodies particularly as of indium arsenide or indium antimonide which have orthogonal axes along one of which is passed a bias current and across the other of which there is developed an output voltage when the plate is threaded by a magnetic flux. In order to obtain the maximum of signal to noise ratio, and especially an essentially zero background voltage when no flux is threading the Hall plate, it is essential that the two output lead connections be made at opposite sides of the Hall plate precisely on an equipotential line. But lead connections to semi-conductive materials made typically by soldering are difficult at best, and are especially difficult to make at precise locations. Accordingly, the Hall plates as heretofore provided have been expensive and have suffered from appreciable background noise.

By our invention we provide a new technique of making lead connections to Hall plates which enables the location of the connections to be made precisely on an equipotential line. This technique is carried out to a first approximation by forming the Hall plate to a precise shape having integral side tabs or terminals at the prescribed equipotential line. Preferably, the tabs are made very narrow where they lead off from the body of the Hall plate and are made wider at their outer ends so as to provide a suitable area for a solder connection. The solder connections are in this way not critical since the effective points where the tabs lead off from the Hall plate determine the location of the side connections. Thus, side connections can be made by this technique with the accuracy with which the tabs can be located in the commercial production of the Hall plates. Where still greater accuracy is needed, we find the present shape of Hall plate to be particularly advantageous because a plate with integral side tabs has effective lead-out connections which are very sensitive to slight erosion of the side edges of the Hall plate adjacent to the tabs. For example, a slight erosion of the side edge of the Hall plate at one side of a tab has the effect of shifting the effective electrical connection towards the opposite side of the tab. Our technique enables therefore side lead connections to be made to a first order of accuracy commensurate with the accuracy with which the shape of the Hall plate can be formed by production methods, and enables lead connections of extreme accuracy to be made by eroding a side edge or edges of the Hall plate adjacent the side tabs after the Hall plate is connected in circuit.

It is therefore an object of our invention to provide new and improved Hall plates which can be formed by production methods with higher signal to noise ratios and by lower background noise than has been heretofore possible.

Another object is to provide a new techinque of fabricating a Hall plate which enables the lead-out connections to be made precisely on a transverse equipotential line.

A further object is to provide a new and improved technique of making a lead connection to a Hall plate at a precise point there along.

These and other objects and features of our invention will be apparent from the following descriptions and the appended claims.

Figure 2:
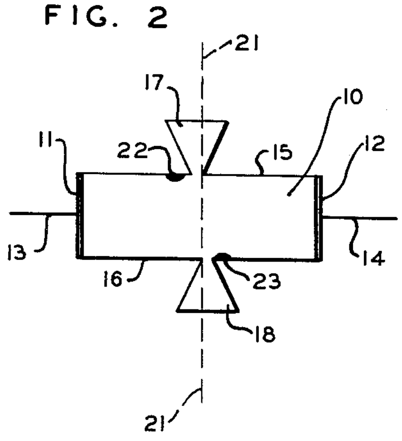

In the description of our invention reference is had to the accompanying drawings, of which:

FIGURE 1 shows a plan view of a preferred form of Hall plate according to our invention; and FIGURE 2 is a plan view of a Hall plate showing a way of effectively making electrical connections on equipotential line of the plate when side tabs thereof are physically displaced from that line.

The Hall crystal shown in FIGURE 1 comprises a thin plate of a suitable semi-conductive material such as of indium arsenide or indium antimonide, a typical thickness of which is from 3 to 30 mils. The semi-conductive materials are very fragile and will break if subjected to mechanical stress or high thermal gradient. Localized lead connections can be made thereto, although with difficulty, by soldering with the use of soft lead-tin solder, but in order to avoid subjecting the Hall plate to a thermal gradient during soldering the same is preferably subjected to suitable overall heating. The plates may have widely different shapes but quadrilateral shapes such as of a square or rectangle are the more usual.

The operation of the Hall plate is such that when supplied with a bias current along one axis in the plane of the plate it will develop an output voltage along an orthogonal axis in the plane of the plate when the plate is threaded by magnetic flux lines normal to the plate, the output voltage which is so developed being proportional to the product of the bias current and the magnetic field. By this principle, the output voltage would be zero when the magnetic field is zero, but this pre-supposes that the output lead connections are made on an equipotential line of the plate. By the procedure heretofore known it has been very difficult to accurately locate the output connections on any such equipotential line, not only because of the difficulty of making a solder connection at any precise point but also because of the difficulty of knowing the exact location of any particular equipotential line since the location of such a line depends upon the geometry of the plate.

In the Hall plate shown in FIGURE 1, lead-inconnections are made at the opposite edges 11 and 12 as by extending respective copper lead wires 13 and 14 therealong and soldering the same thereto with the use of soft lead-in solder. Whether these wires lead off centrally as shown or from corners of the Hall plate is not important since these lead-in connections are not critical. It is by these lead-in connections that a bias current is supplied to the Hall plate, of either A.C. or D.C., from any suitable source not shown. Such bias current sets up equipotential lines crosswise of the plate. For a truly rectangular plate as shown, the equipotential lines are at right angles to the lengthwise axis or dimensions of the plate. It is important that the lead-out connections to the remaining opposite edges 15 and 16 of the plate be located accurately on an equipotential line. For example, suppose that the bias source provides a voltage drop along the length of the Hall plate which has a gradient of 2 volts per inch. Such gradient means that a displacement of one lead-out connection of only 2.5 microinches from an equipotential line passing through the other connection will produce 5 microvolts of background noise across the lead-out connections when there is no magnetic flux passing through the plate. Because of the low sensitivity of the Hall plates, a 5 microvolt background voltage may be more than can be tolerated in many applications. Accordingly, the positioning of the lead-out connections becomes extremely critical.

By our invention the location of the lead-out connections is determined by providing the Hall plate with integral side tabs 17 and 18 preferably of a frusto-triangular shape having an increasing width proceeding outwardly along the tabs, as shown. These tabs are precisely located at predetermined positions according to the shape of the plate, so that they will be electrically situated on the same equipotential line. The plate is formed to a precise shape by any standard precision method of manufacture. Preferably, we form a mask of hardened metal having the exact shape desired for the Hall plate, locate this mask on an oversized plate of the semi-conductive material and remove the excess material to the exact edge of the mask by fine sandblasting. After the plate is so precisely formed to the desired shape respective lead wires 19 and 20 are soft soldered to the central outer end portions of the tabs, but a precise location of the points on the tabs where the solder connections are effectively made is now no longer critical since the positioning of the tabs along the plate determines in the main the effective electrical location of the connections.

In the embodiment shown in FIGURE 2, the side tabs 17 and 18 are both shown displaced to an exaggerated extent from an equipotential line indicated by the dash dot cross line 21. Even though lead-out tabs are physically displaced from the desired equipotential line to which effective electrical connection is to be made, such electrical connection on the desired equipotential line can be made precisely by eroding the side edges of the Hall plate at the sides of the tabs which are the farther from the equipotential line. This eroding is done after the Hall plate is connected in circuit as by means of a sharp edged tool, fine sand paper, or the like. An advantage of using a shape of Hall plate having integral side tabs or terminals is that the effective electrical connections can be displaced easily along the plate by eroding the edges of the plate at the sides of the tabs in the manner described. For example, the side edge 15 may be recessed slightly at 22 and the side edge 16 may be recessed slightly at 23 to bring the electrical connections precisely on the equipotential line. Further, by the present technique Hall plates can be made for special applications where special shapes are required or where there are dimensional limitations as to where the side tabs may be located.

The embodiments of our invention herein particularly shown and described are intended to be illustrative and not limitative of our invention since the same are subject to changes and modifications without departure from the scope of our invention, which we endeavor to express according to the following claims.

We claim:

1. A Hall crystal comprising a quadrilateral plate-like body of a semi-conductive material, lead connections to one pair of opposite edges of said semi-conductive body for supplying a bias current thereto, and voltage lead-out connections to the remaining pair of opposite edges of said semi-conductive body, said latter lead connections comprising narrow integral tab-like portions of said body projecting laterally from said remaining opposite edges and of widths where the tabs lead from said edges which are minor fractions of the lengths of said edges, and lead wires soldered to said tab-like portions.

2. The Hall crystal set forth in claim 1 wherein said tab-like portions are of a frusto-triangular shape having an increasing width proceeding from the semi-conductive body to the outer ends of the tab-like portions.

3. A Hall plate of rectangular shape having lead-in connections to the edges of opposite ends of the plate for supplying a bias current thereto, and having lead-out connections to the remaining opposite edges of the plate for providing an output voltage when the plate is threaded by a magnetic flux, said lead-out connections comprising integral side extensions of the Hall plate forming tabs on said plate and lead wires joined to said tabs, said tabs being located at equal distances along said plate to minimize output voltage across said lead-out connections from the bias current when the magnetic flux through the plate is zero, one of said tabs being at least slightly displaced along the Hall plate from the equipotential line through the other tab, and the side edge of said plate at the side of said tab which is the farther from said equipotential line being eroded to place the effective lead-out connection through said one tab at said equipotential line.

4. A Hall plate having lead-in connections for supplying a bias current thereto and lead-out connections for supplying an external voltage when said plate is threaded by a magnetic flux, said lead-out connections comprising integral side extensions of the Hall plate forming tabs on said plate and lead wires joined to outer end portions of said tabs, at least one of said tabs being physically displaced from a prescribed equipotential line across said plate, and said plate having a recessed edge at the side of said one tab which is the farther from said equipotential line for effectively electrically shifting the connection made by said one tab to said equipotential line.

References Cited in the file of this patent

UNITED STATES PATENTS

| | | |
|---|---|---|
| 2,653,374 | Mathews et al. | Sept. 29, 1953 |
| 2,697,269 | Fuller | Dec. 21, 1954 |
| 2,725,504 | Dunlap | Nov. 29, 1955 |
| 2,855,549 | Kuhrt et al. | Oct. 7, 1958 |
| 2,877,309 | Henisch | Mar. 10, 1959 |
| 2,914,728 | Brophy et al. | Nov. 24, 1959 |